(12) United States Patent
Yoon

(10) Patent No.: US 9,947,394 B2
(45) Date of Patent: Apr. 17, 2018

(54) NONVOLATILE MEMORY DEVICE INCLUDING PAGE BUFFER AND METHOD FOR READING DATA WITHOUT A DUMPING PROCESS FOR BACKING UP DATA

(71) Applicant: SAMSUNG ELECTRONICS CO., LTD., Suwon-si, Gyeonggi-do (KR)

(72) Inventor: Hyun-Jun Yoon, Changwon-si (KR)

(73) Assignee: Samsung Electronic Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/361,451

(22) Filed: Nov. 27, 2016

(65) Prior Publication Data

US 2017/0256309 A1    Sep. 7, 2017

(30) Foreign Application Priority Data

Mar. 2, 2016    (KR) .................. 10-2016-0025042

(51) Int. Cl.
| | |
|---|---|
| *G11C 11/34* | (2006.01) |
| *G11C 11/56* | (2006.01) |
| *G11C 16/08* | (2006.01) |
| *G11C 16/34* | (2006.01) |

(52) U.S. Cl.
CPC ...... *G11C 11/5642* (2013.01); *G11C 11/5628* (2013.01); *G11C 16/08* (2013.01); *G11C 16/3459* (2013.01)

(58) Field of Classification Search
None
See application file for complete search history.

(56) References Cited

U.S. PATENT DOCUMENTS

| | | |
|---|---|---|
| 7,310,275 B2 | 12/2007 | Cha |
| 8,004,892 B2 | 8/2011 | Vali et al. |
| 8,085,607 B2 | 12/2011 | Park et al. |
| 8,351,274 B2 | 1/2013 | Ha et al. |
| 8,559,226 B2 | 10/2013 | Abe et al. |
| 8,949,491 B1 | 2/2015 | Lin et al. |
| 8,976,599 B2 | 3/2015 | Lee |
| 2005/0152188 A1* | 7/2005 | Ju ............. G11C 16/3454 365/185.22 |
| 2008/0094929 A1* | 4/2008 | Rinerson ........... G11C 11/16 365/208 |
| 2011/0205805 A1* | 8/2011 | Honma .......... G11C 11/5628 365/185.22 |
| 2014/0022853 A1 | 1/2014 | Choi et al. |
| 2014/0140148 A1* | 5/2014 | An ............... G11C 11/5642 365/189.14 |
| 2017/0011799 A1* | 1/2017 | Lee ................. G11C 16/10 |

* cited by examiner

*Primary Examiner* — Harry W Byrne
*Assistant Examiner* — Sultana Begum
(74) *Attorney, Agent, or Firm* — Volentine & Whitt, PLLC

(57) ABSTRACT

A nonvolatile memory device including a page buffer and a method of operating the nonvolatile memory device, the method including performing a first sensing operation using a first sensing voltage; precharging some bit lines from among a plurality of bit lines, according to first data stored in a first latch unit of a page buffer due to the first sensing operation; resetting the first latch unit; and performing a second sensing operation using a second sensing voltage.

20 Claims, 20 Drawing Sheets

US 9,947,394 B2

NONVOLATILE MEMORY DEVICE INCLUDING PAGE BUFFER AND METHOD FOR READING DATA WITHOUT A DUMPING PROCESS FOR BACKING UP DATA

CROSS-REFERENCE TO RELATED APPLICATION

A claim for priority under 35 U.S.C. § 119 is made to Korean Patent Application No. 10-2016-0025042, filed on Mar. 2, 2016, in the Korean Intellectual Property Office, the disclosure of which is incorporated herein in its entirety by reference.

BACKGROUND

The inventive concepts described herein relate to a nonvolatile memory device, and more particularly to a nonvolatile memory device including a page buffer and a method of operating the nonvolatile memory device.

Nonvolatile memory devices used as semiconductor memory devices may store data even when power is shut off. Flash memory devices are a type of nonvolatile memory and are widely used, for example, in universal serial bus (USB) drives, digital cameras, mobile phones, smart phones, tablet PCs, memory cards, and solid-state drives (SSDs), or the like.

Data may be read by performing a plurality of sensing operations in order to improve the performance of a nonvolatile memory device. However, when a result of a plurality of sensing operations has to be backed up, a storage device having storage capacity large enough to back up the result of the sensing operation is required.

SUMMARY

Embodiments of the inventive concepts provide a nonvolatile memory device for reading data without a dumping process for backing up data, and a method of operating the nonvolatile memory device.

Embodiments of the inventive concepts provide a method of operating a nonvolatile memory device including performing a first sensing operation on memory cells of the nonvolatile memory device using a first sensing voltage; precharging some bit lines from among a plurality of bit lines connected to the memory cells, according to first data stored in a first latch unit of a page buffer due to the first sensing operation; resetting the first latch unit after the precharging; and performing a second sensing operation on the memory cells using a second sensing voltage.

Embodiments of the inventive concepts provide a method of operating a nonvolatile memory device including a page buffer, the page buffer including a first latch unit connected to sensing nodes and a second latch unit electrically connected to the first latch unit. The method includes storing a result of a first sensing operation performed on a plurality of memory cells in the first latch unit, in response to a read command; selectively precharging some bit lines from among a plurality of bit lines connected to the plurality of memory cells according to a logic state of the first latch unit; after the selectively precharging, setting the first latch unit to a first logic state without dumping the result of the first sensing operation stored in the first latch unit to the second latch unit; and storing a result of a second sensing operation performed on at least some memory cells from among the plurality of memory cells in the first latch unit.

Embodiments of the inventive concepts further provide a method of operating a nonvolatile memory device including setting a logic state of a first latch unit to a first logic state; precharging all of a plurality of bit lines connected to the first latch unit according to the set logic state of the first latch unit; after the precharging, performing a first sensing operation on memory cells connected to the plurality of bit lines using a first sensing voltage and storing a result of the first sensing operation as data in the first latch unit; selectively precharging some of the plurality of bit lines according to a logic state of the data stored in the first latch unit; after the selectively precharging, setting the logic state of the first latch unit to the first logic state; and performing a second sensing operation on the memory cells using a second sensing voltage and storing a result of the second sensing operation in the first latch unit as final data.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

The inventive concepts will now be described more fully with reference to the accompanying drawings, in which embodiments are shown.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
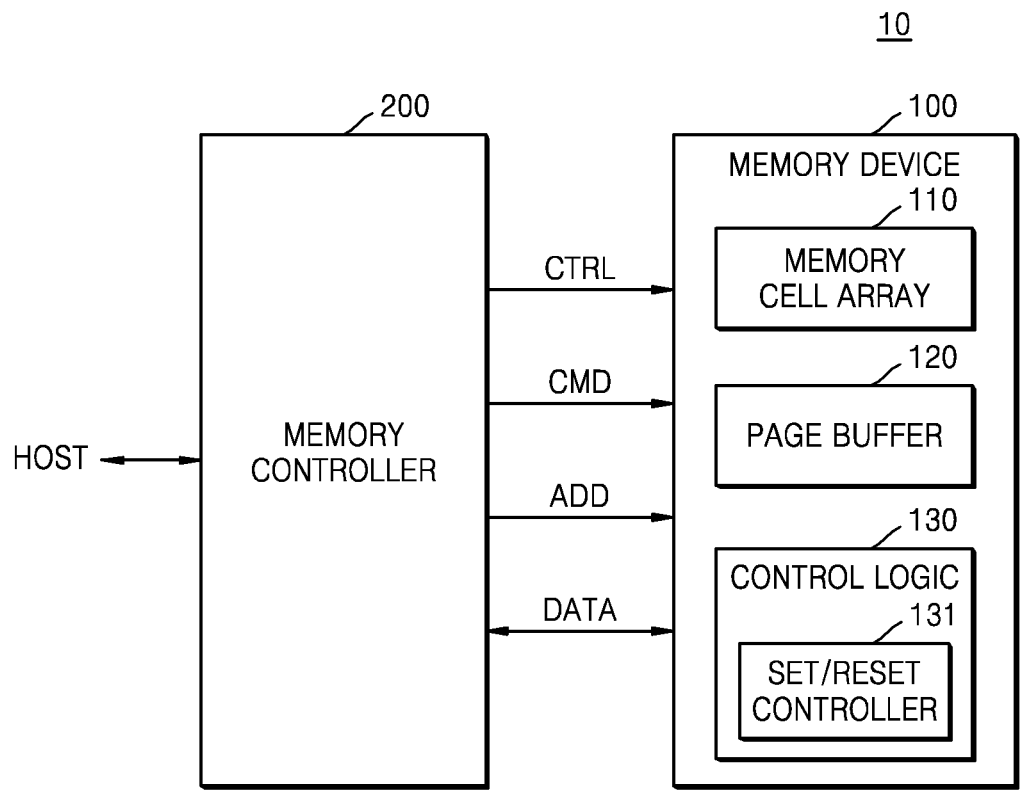
FIG. 1 illustrates a block diagram of a memory system according to an embodiment of the inventive concepts.

FIG. 1 illustrates a block diagram of a memory system 10 according to an embodiment of the inventive concepts. The memory system 10 includes a memory device 100 and a memory controller 200. In embodiments of the inventive concepts, the memory device 100 may be a nonvolatile memory device that stores and maintains data even when power is shut off. For example, the memory device 100 may be a flash memory device including flash memory cells. Alternatively, the memory device 100 may for example be a memory device such as resistive random-access memory (ReRAM), magnetoresistive RAM (MRAM), or phase-change RAM (PRAM) including resistive memory cells. The following description will be based on the assumption that the memory device 100 is a flash memory device including NAND or NOR flash memory cells. However, the inventive concepts may be applied to other types of memory devices and should not be limited to the above described memory devices.

The memory controller 200 may control the memory device 100 to read data stored in the memory device 100 or write data to the memory device 100 in response to a write/read request from a host HOST. In detail, the memory controller 200 may control a program (or write) operation, a read operation, and an erase operation to be performed on the memory device 100 by applying an address ADD, a command CMD, and a control signal CTRL to the memory device 100. Also, data DATA to be written and read data DATA may be transmitted/received between the memory controller 200 and the memory device 100.

The memory controller 200 may be configured to communicate with the host HOST using various standard interface protocols. For example, the memory controller 200 may include a host interface (not shown), and the host interface may provide various standard interfaces between the host HOST and the memory controller 200. The standard interfaces may for example communicate using at least one interface protocol selected from various interface protocols such as advanced technology attachment (ATA), serial ATA (SATA), external SATA (e-SATA), small computer small interface (SCSI), serial attached SCSI (SAS), peripheral component interconnection (PCI), PCI express (PCI-E), IEEE 1394, universal serial bus (USB), secure digital (SD) card, multimedia card (MMC), embedded multimedia card (eMMC), universal flash storage (UFS), and compact flash (CF) card, or the like.

The memory device 100 includes a memory cell array 110, a page buffer 120, and a control logic 130. When it is assumed that the memory cell array 110 includes flash memory cells, the memory cell array 110 may include a plurality of NAND strings, and each of the NAND strings may include memory cells that are respectively connected to word lines vertically stacked on a substrate. As such, in an embodiment of the inventive concepts, the memory cell array 110 may be a three-dimensional (3D) memory array. The 3D memory array may be monolithically formed at one or more physical levels of memory cell arrays having an active area disposed over a silicon substrate and circuitry associated with operations of memory cells and formed over or in the silicon substrate. The term "monolithic" means that layers of each level of the array are directly stacked on layers of each underlying level of the array.

In an embodiment of the inventive concepts, the 3D memory array includes NAND strings that are vertically oriented so that at least one memory cell is located over another memory cell. The at least one memory cell may include a charge trap layer. U.S. Pat. Nos. 7,679,133; 8,553,466; 8,654,587; and 8,559,235 and U.S. Patent Publication No. 2011-0233648, hereby incorporated by reference, disclose suitable configurations for 3D memory arrays in which 3D memory arrays are configured as a plurality of levels and word lines and/or bit lines are shared between the levels are disclosed in. Also, U.S. Patent Publication Nos. 2012-0051138 and 2011-0204420 are hereby incorporated by reference.

The page buffer 120 may store data to be transmitted to the memory cell array 110 and data read from the memory cell array 110. The page buffer 120 may include one or more latch units. For example, each of the latch units may include a plurality of latches respectively corresponding to a plurality of bit lines, and may store data in units of pages. According to an embodiment, the page buffer 120 may include a sensing latch unit (not shown), and the sensing latch unit may include a plurality of sensing latches respectively corresponding to a plurality of bit lines. Also, each of the sensing latches may be connected to a sensing node (not shown) at which data is detected through a bit line corresponding to the sensing latch.

The control logic 130 may control an overall operation of the memory device 100. For example, the control logic 130 may control the memory device 100 to perform a memory operation corresponding to a command CMD received from the memory controller 200. For example, the control logic 130 may generate various internal control signals used in the memory device 100 in response to a control signal CTRL. According to an embodiment, the control logic 130 may adjust a level of a voltage applied to word lines and bit lines during a memory operation such as a read operation.

The memory cells included in the memory cell array 110 may have a threshold voltage distribution according to programmed data. For example, when the memory cell array 110 includes single-level cells that store one bit per memory cell, the memory cells may have two threshold voltage distributions according to program states. Alternatively, when the memory cell array 110 includes multi-level cells that store two or more bits per memory cell, the memory cells may have four or more threshold voltage distributions according to program states.

When a read operation is performed on the memory cell array 110, a plurality of read operations may be performed according to threshold voltage distributions of the memory cells. For example, when the memory cells include two threshold voltage distributions, one read operation may be performed in order to distinguish the two threshold voltage distributions. Alternatively, when the memory cells include four threshold voltage distributions, three read operations may be performed in order to distinguish the four threshold voltage distributions.

Each read operation may include a plurality of sensing operations. For example, in order to increase the accuracy of a read operation, one read operation may be performed by using a plurality of sensing operations using sensing voltages having different levels. For example, each read operation may include a coarse sensing operation that coarsely distinguishes data by using a sensing voltage having a pre-read level, and a fine sensing operation that finely distinguishes data by using a sensing voltage having a read level. The read level may have a value corresponding to one level between threshold voltage distributions to generate actual final data (or read data). In contrast, the pre-read level may be different from the read level. For example, the pre-read level may be lower than the read level.

According to an embodiment, the control logic 130 may include a set/reset controller 131. The set/reset controller 131 may control setting/resetting of a latch unit (not shown) included in the page buffer 120. For example, the page buffer 120 may include a sensing latch unit that senses a voltage of a sensing node during a sensing operation, and the set/reset controller 131 may set a state of the sensing latch unit to a first logic state or a second logic state by controlling setting/resetting of the sensing latch unit.

Also, the page buffer 120 may further include another latch unit (e.g., a data latch unit) that is electrically connected to the sensing latch unit. According to an embodiment, final data (or read data) may be generated without performing a process of dumping data stored in the sensing latch unit to another latch unit such as the data latch unit through a sensing operation, and in this process, the sensing latch unit may be set/reset after any one sensing operation is performed and before a next sensing operation is performed.

For example, as the sensing latch unit is reset before a first sensing operation, the sensing latch unit may be set to a first logic state. Next, first data may be stored in the sensing latch unit due to the first sensing operation using a pre-read level. Accordingly, a logic state of some sensing latches (e.g., sensing latches corresponding to bit lines connected to off-cells) of the sensing latch unit may be changed to a second logic state. Next, some bit lines from among a plurality of bit lines may be selectively precharged according to a logic state of data stored in the sensing latch unit. For example, bit lines corresponding to the sensing latches having the second logic state may be selectively precharged. That is, a second sensing operation may be performed only on memory cells having a threshold voltage having a level higher than the pre-read level.

After the precharge operation is performed, the sensing latch unit may be set/or reset under the control of the set/reset controller 131. Next, second data may be stored in the sensing latch unit during the second sensing operation using a read level, for memory cells connected to the precharged bit lines. According to a result of the second sensing operation, a logic state of latches corresponding to bit lines connected to off-cells may be changed to the second logic state. Also, a result of the second sensing operation may be transmitted to the outside as final data of a read operation.

In a general memory system, in order to generate final data by combining first data sensed by a first sensing operation with second data sensed by a second sensing operation, a process of dumping the first data stored in a sensing latch unit to a data latch unit is performed before the second sensing operation is performed. However, according to an embodiment of the inventive concept, a dumping process may be omitted in a read operation. Accordingly, since final data may be generated without a process of dumping data, a time taken to perform the dumping process may be avoided and a read speed may be increased. Also, since a data latch unit for temporarily storing data through a dumping process is not required, resources for realizing a page buffer may be reduced. Also, when the page buffer includes additional latches such as a data latch unit, the additional latches may be used to perform functions other than a data read operation, thereby efficiently using resources of the page buffer.

Although one read operation according to this described embodiment includes two sensing operations, the inventive concept is not limited thereto and the read operation may include more than two sensing operations. Also, although a sensing latch unit is reset before a first sensing operation is performed in the present embodiment, the sensing latch unit may be controlled to have a set state before the first sensing operation is performed, or may be controlled to have a set state or a reset state after the first sensing operation is performed.

The memory device 100 and the memory controller 200 may be integrated into one semiconductor device. For example, the memory device 100 and the memory controller 200 may be integrated into one semiconductor device, and may constitute a memory card. For example, the memory device 100 and the memory controller 200 may be integrated into one semiconductor device, and may constitute a PC card (previously known as a personal computer memory card international association (PCMCIA)), a compact flash (CF) card, a smart media card (SM/SMC), a memory stick, a multimedia card (e.g., MMC, RS-MMC, or MMCmicro), an SD card (e.g., SD, miniSD, microSD), or an UFS, or the like. Alternatively, the memory device 100 and the memory controller 200 may be integrated into one semiconductor device, and may constitute a solid-state disk/drive (SSD).

Figure 2:
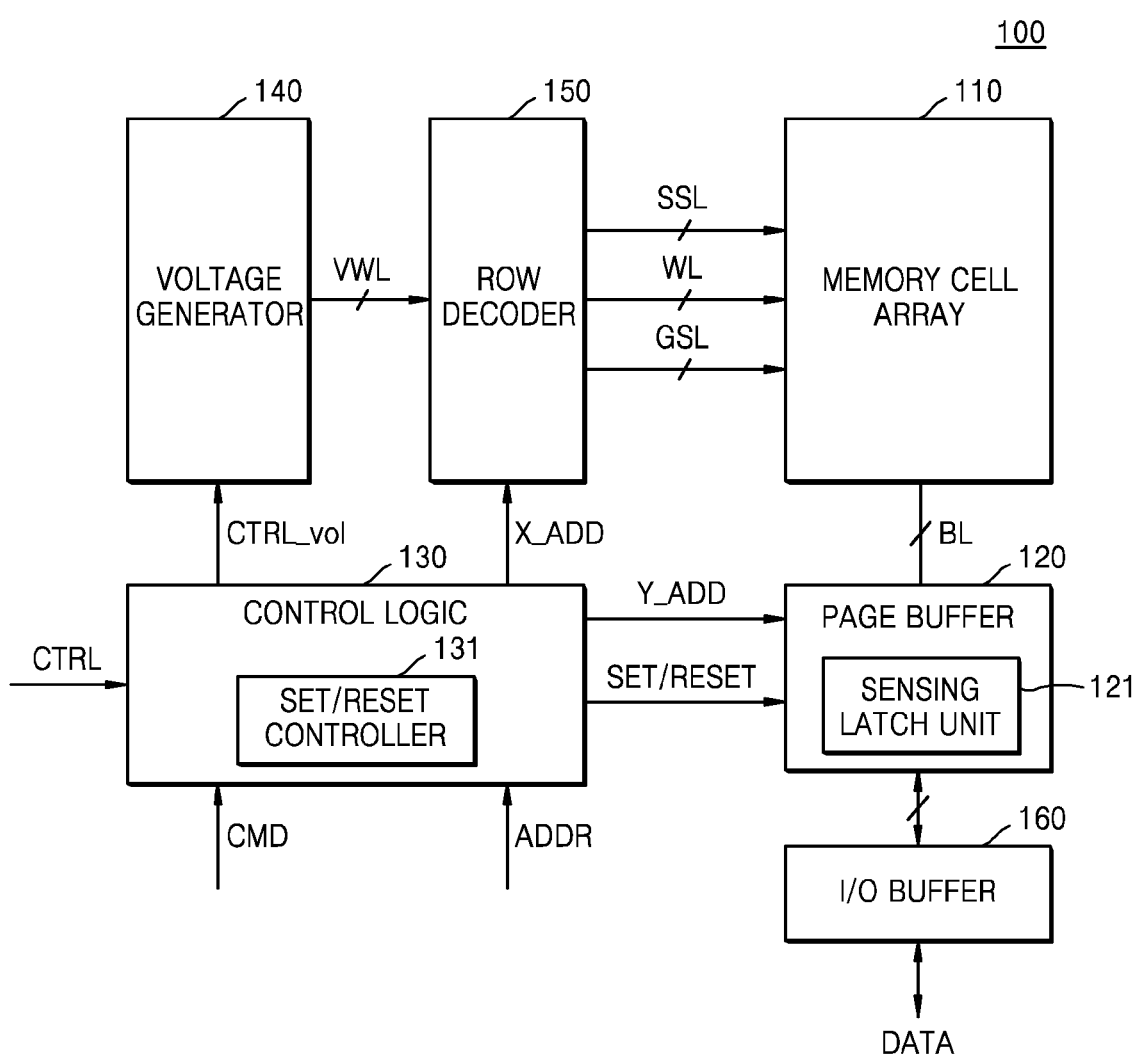
FIG. 2 illustrates a block diagram of a memory device of FIG. 1 according to an embodiment of the inventive concepts.

FIG. 2 illustrates a block diagram of the memory device 100 of FIG. 1 according to an embodiment of the inventive concepts.

Referring to FIG. 2, the memory device 100 includes the memory cell array 110, the page buffer 120, the control logic 130, a voltage generator 140, a row decoder 150, and an input/output buffer 160. Also, the control logic 130 includes the set/reset controller 131. Although not shown in FIG. 2, the memory device 100 may further include various functional blocks related to a memory operation such as an input/output interface.

The memory cell array 110 may include a plurality of memory cells, and the plurality of memory cells may be connected to word lines WL, one or more string selection lines SSL, one or more ground selection lines GSL, and bit lines BL. In detail, the memory cell array 110 may be connected to the row decoder 150 through the word lines WL, the string selection lines SSL, and the ground selection lines GSL, and may be connected to the page buffer 120 through the bit lines BL.

The memory cell array 110 may include a plurality of cell blocks, and each of the cell blocks may have a two-dimensional (2D) structure (or a planar structure) or a 3D structure (or a vertical structure). The memory cell array 110 may include a plurality of memory cells, and the plurality of memory cells may include single-level cells that store one bit per cell or multi-level cells that store two or more bits per cell.

The page buffer 120 may be connected to the bit lines BL, and may temporarily store write data or may temporarily store read data. The page buffer 120 may include a plurality of buffers respectively corresponding to the bit lines BL. For example, each of the buffers may be connected to a bit line through a sensing node.

According to an embodiment, the page buffer 120 may include one or more latch units. For example, the page buffer 120 may include a sensing latch unit 121 that senses a voltage of a sensing node and stores data. The sensing latch unit 121 may include a plurality of sensing latches respectively corresponding to the plurality of bit lines BL, and each of the sensing latches may be connected to a bit line through a sensing node corresponding to the sensing latch. Although not shown in FIG. 2, the page buffer 120 may further include an additional latch unit that may be used in relation to write and/or read operations in addition to the sensing latch unit 121.

The input/output buffer 160 may receive data DATA from an external controller (e.g., memory controller 200 in FIG. 1), and transmit the received data DATA to the page buffer 120. Alternatively, the input/output buffer 160 may receive data DATA from the page buffer 120 and transmit the received data DATA to the external controller.

The control logic 130 may output various internal control signals for writing data to the memory cell array 110, reading data from the memory cell array 110, or erasing data stored in the memory cell array 110, based on a command CMD, an address ADD, and a control signal CTRL received from an external controller (e.g., memory controller 200 in FIG. 1).

The various internal control signals output from the control logic 130 may be applied to the page buffer 120, the voltage generator 140, and the row decoder 150. In detail, the control logic 130 may apply a voltage control signal CTRL_vol to the voltage generator 140. The voltage generator 140 may include one or more pumps (not shown), and may generate voltages having various levels according to a pumping operation based on the voltage control signal CTRL_vol.

The control logic 130 may apply a row address X_ADD to the row decoder 150, and may apply a column address Y_ADD to the page buffer 120. Also, the control logic 130 may control a set/reset operation to be performed on the sensing latch unit 121 in relation to a sensing operation (or a read operation). To this end, the control logic 130 may apply a set/reset control signal SET/RESET to the page buffer 120.

In an embodiment, the sensing latch unit 121 may have a first logic state according to set/reset control signal SET/RESET indicating a reset. The first logic state may be defined in various ways, and may have, for example, a logic high value or a logic low value. According to an embodiment, the control logic 130 may control a set/reset state of the sensing latch unit 121 at various times related to a read operation. For example, the control logic 130 may control a set/reset state of the sensing latch unit 121 at a time when each sensing operation included in one read operation is completed.

According to an embodiment, when one read operation includes first and second sensing operations, the sensing latch unit 121 may be reset between the first sensing operation and the second sensing operation. For example, the sensing latch unit 121 may be reset and then the first sensing operation may be performed. As the first sensing operation is performed, data (e.g., first data) may be stored in the sensing latch unit 121. Next, some of a plurality of bit lines may be selectively precharged according to the first data stored in the sensing latch unit 121, and the sensing latch unit 121 may be reset before the second sensing operation is performed on memory cells respectively corresponding to the precharged bit lines. Next, as the second sensing operation is performed, data (e.g., second data) may be stored in the sensing latch unit 121, and the second data may be output as final data of the read operation.

Figure 3:
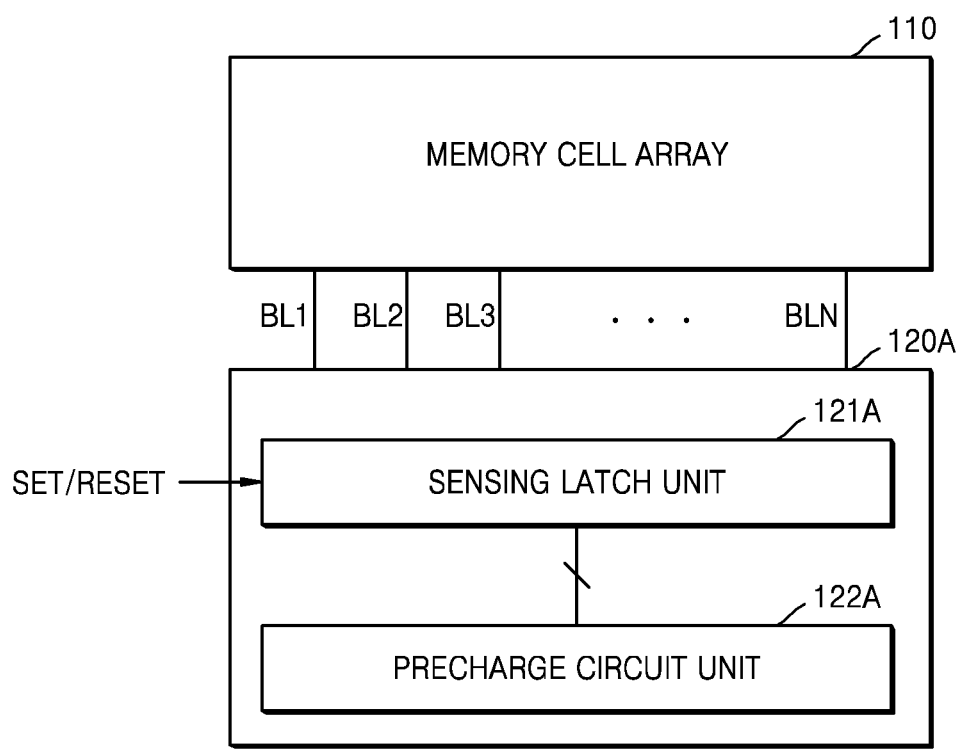
FIGS. 3 and 4 illustrate block diagrams of a page buffer according to various embodiments of the inventive concepts.
Figure 4:
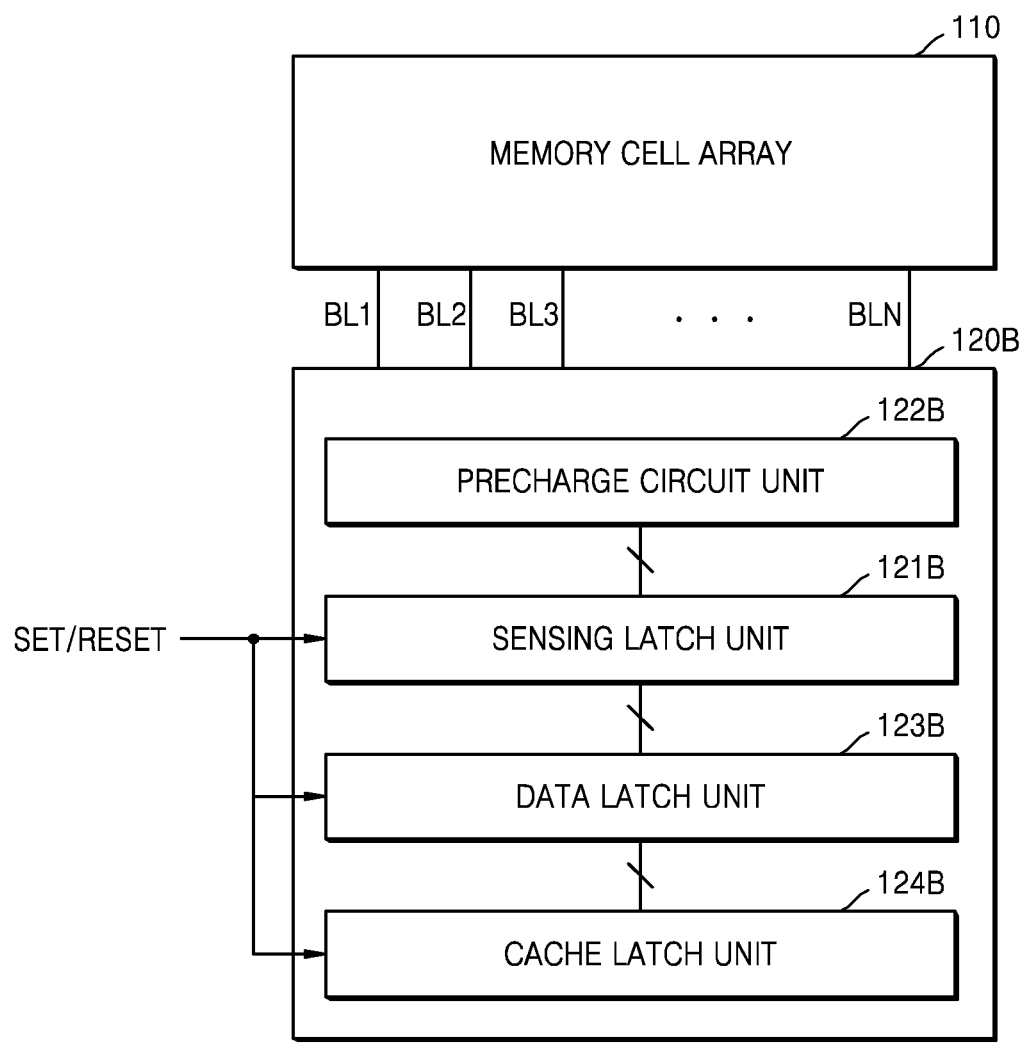

FIGS. 3 and 4 illustrate block diagrams of a page buffer according to various embodiments of the inventive concepts. The page buffers 120A and 120B of FIGS. 3 and 4 may correspond to page buffer 120 of memory device 100 in FIG. 2. In FIGS. 3 and 4, only the respective page buffers 120A and 120B and memory cell array 110 of the memory device are shown and described, and illustration and description of the other circuits within the memory device are omitted for the sake of clarity.

In FIG. 3, a memory device including the memory cell array 110 and a page buffer 120A is shown. The page buffer 120A may be connected to the memory cell 110 through a plurality of bit lines, for example, first through $N^{th}$ bit lines BL1 through BLN. Also, the page buffer 120A includes a sensing latch unit 121A that senses voltages of sensing nodes and stores data, and a precharge circuit unit 122A that performs a precharge operation on the first through $N^{th}$ bit lines BL1 through BLN.

According to the above embodiment, the sensing latch unit 121A is set or reset in response to the set/reset control signal SET/RESET. Also, according to the above embodiment, the sensing latch unit 121A is controlled to be set/reset at various points related to a read operation. For example, the sensing latch unit 121A may be set or reset at least one time after one sensing operation ends and before a next sensing operation starts. In FIG. 3, data stored in the sensing latch unit 121A does not need to be dumped to another latch unit, and thus the page buffer 120A may be configured so as not to include an additional latch unit for dumping data.

In FIG. 4, a memory device including the memory cell array 110 and a page buffer 120B is shown. The page buffer 120B includes a sensing latch unit 121B that senses voltages of sensing nodes and stores data, and a precharge circuit unit 122B that performs a precharge operation on the first through $N^{th}$ bit lines BL1 through BLN. Also, according to an embodiment, the page buffer 120B further includes one or more latch units. For example, the page buffer 120B further includes a data latch unit 123B and a cache latch unit 124B.

The cache latch unit 124B may temporarily store data that is transmitted/received to/from an external controller (not shown). For example, in a read operation, data (e.g., final data) stored in the sensing latch unit 121B may be transmitted to the outside through the cache latch unit 124B.

According to an embodiment, the data latch unit 123B may be used to perform other functions without receiving sensed data, in relation to a read operation. For example, data that is used for an operation un-related to a current read operation may be stored in the data latch unit 123B. That is, data may be read in a current read operation without using the data latch unit 123B. For example, write data such as user data may be kept in the data latch unit 123B before the current read operation. Also, when a plurality of read operations are continuously performed, data read from a previous read operation may be kept in the data latch unit 123B, irrespective of a current read operation.

Figure 5:
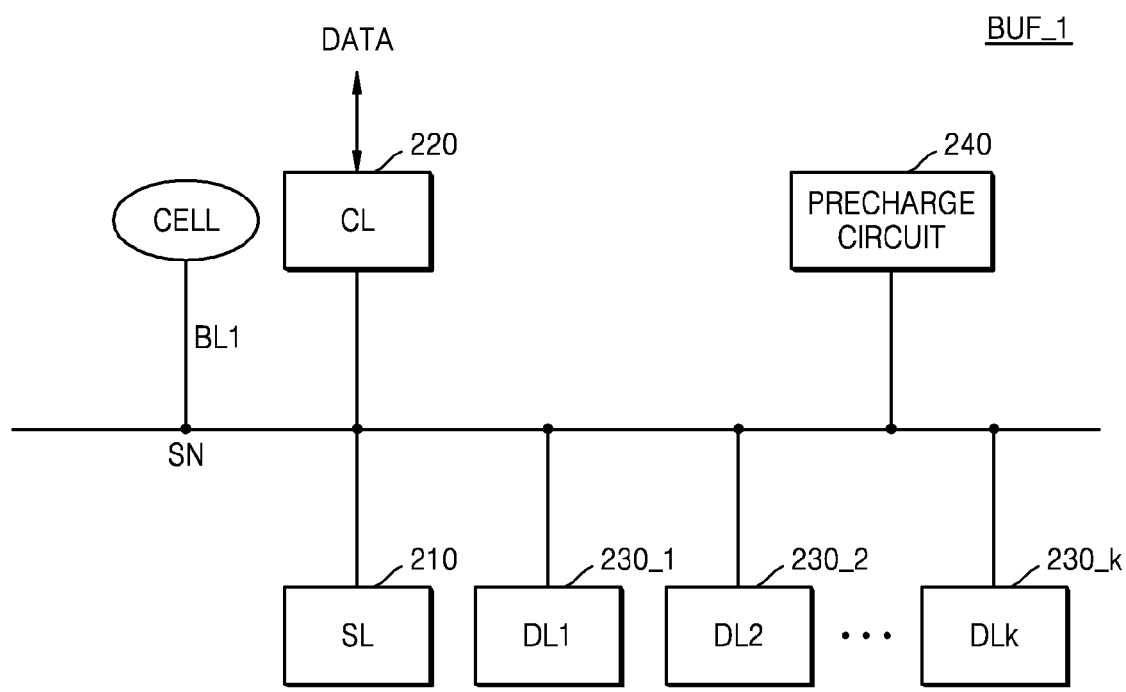
FIG. 5 illustrates a block diagram of a buffer in a page buffer connected to one bit line, according to an embodiment of the inventive concepts.

FIG. 5 illustrates a block diagram of a buffer in a page buffer connected to one bit line, according to an embodiment of the inventive concepts. In this example, the buffer of the page buffer is connected to the first bit line BL1, and the page buffer may correspond to page buffer 120 of FIG. 2 for example.

As shown in FIG. 5, one buffer (e.g., a first buffer BUF_1) may include a sensing latch (SL) 210, a cache latch (CL) 220, one or more data latches (DL1, DL2, . . . DLk), for example, first through $k^{th}$ data latches 230_1, and 230_2 through 230_k (hereinafter referred to as first through $k^{th}$ data latches 230_1 through 230_k), and a precharge circuit 240.

The precharge circuit 240 applies a precharge voltage to the first bit line BL1 connected to a memory cell CELL on which a read operation is to be performed. For example, the precharge circuit 240 may determine whether to perform a precharge operation on the first bit line BL1 according to a logic state stored in the sensing latch 210. For example, when a logic state of the sensing latch 210 is a logic state corresponding to data from an off-cell, the precharge circuit 240 precharges the first bit line BL1. In contrast, when a logic state of the sensing latch 210 is a logic state corresponding to data from an on-cell, a precharge operation on the first bit line BL1 may be turned off. Also, for example, the precharge circuit 240 may receive a signal based on data stored in the sensing latch 210, and may determine whether to precharge the first bit line BL1 in response to the signal.

The sensing latch 210 is connected to a sensing node SN and may store data from the memory cell by latching a voltage of the sensing node SN. Also, the cache latch 220 may transmit/receive data to/from an external controller. For example, the cache latch 220 may temporarily store data received from a controller during a write operation and may temporarily store read data during a read operation.

The first through $k^{th}$ data latches 230_1 through 230_k may be used to perform various functions. For example, during a read operation, write data stored in the cache latch 220 may be transmitted to the first through $k^{th}$ data latches 230_1 through 230_k. Also, a write operation may be performed according to data stored in the first through $k^{th}$ data latches 230_1 through 230_k.

According to an embodiment, final data in a read operation may be generated without dumping data stored in the sensing latch 210 to the first through $k^{th}$ data latches 230_1 through 230_k. For example, final data stored in the sensing latch 210 may be transmitted to the external controller through the cache latch 220. According to an embodiment, since the first through $k^{th}$ data latches 230_1 through 230_k do not need to store sensed data in a read operation, the first through $k^{th}$ data latches 230_1 through 230_k may be used to perform various other functions. For example, in substantially the same manner as that described above, the first through $k^{th}$ data latches 230_1 through 230_k may be used to keep data read in a previous read operation or write data such as user data as data un-related to a current read operation.

Figure 6A:
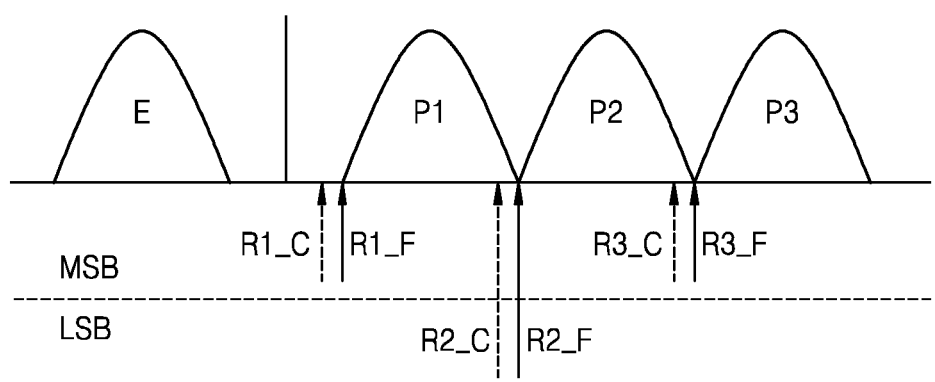
FIGS. 6A and 6B illustrate graphs of a threshold voltage distribution and a sensing voltage in a multi-level cell according to an embodiment of the inventive concepts.
Figure 6B:
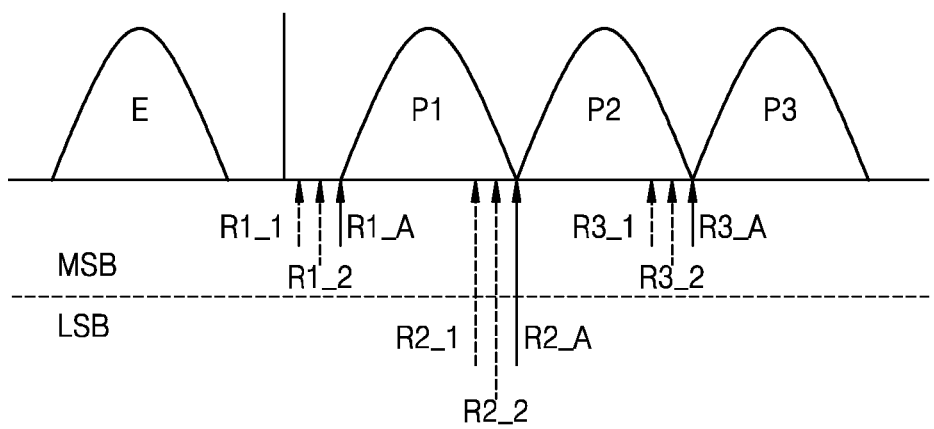

FIGS. 6A and 6B illustrate graphs of a threshold voltage distribution and a sensing voltage in a multi-level cell according to an embodiment of the inventive concepts. In FIGS. 6A and 6B, two bits are stored in one memory cell. However, in other embodiments more than two bits may be stored in one memory cell.

Referring to FIG. 6A, memory cells may have four threshold voltage distributions according to program states. The four threshold voltage distributions may include, for example, a distribution corresponding to an erase state E, and distributions corresponding to first through third states P1, P2 and P3.

A read operation may include a sequence of sensing operations. For example, in order to read data stored in a multi-level cell, least significant bit data LSB may be distinguished by a read operation using sensing voltages having a level between the first state P1 and the second state P2. Also, most significant bit data MSB may be distinguished by a read operation using sensing voltages having a level between the erase state E and the first state P1, and a read operation using sensing voltages having a level between the second state P2 and the third state P3.

As described above, each read operation may include a plurality of sensing operations. For example, each read operation may include a first sensing operation (e.g., a coarse sensing operation) using a first sensing voltage (or a sensing voltage having a pre-read level) and a second sensing operation (e.g., a fine sensing operation) using a second sensing voltage (or a sensing voltage having a read level). As shown in FIG. 6A, a first read operation may include a first sensing operation using a first sensing voltage R1_C and a second sensing operation using a second sensing voltage R1_F. Likewise, a second read operation may include a first sensing operation using a first sensing voltage R2_C and a second sensing operation using a second sensing voltage R2_F, and a third read operation may include a first sensing operation using a first sensing voltage R3_C and a second sensing operation using a second sensing voltage R3_F.

In FIG. 6B, one read operation includes three or more sensing operations. Referring to FIG. 6B, a first read operation may include first through $A^{th}$ sensing operations using first through $A^{th}$ sensing voltages R1_1 through R1_A. Also, likewise, a second read operation may include first through $A^{th}$ sensing operations using first through $A^{th}$ sensing voltages R2_1 through R2_A, and a third read operation may include first through $A^{th}$ sensing operations using first through $A^{th}$ sensing voltages R3_1 through R3_A.

Figure 7:
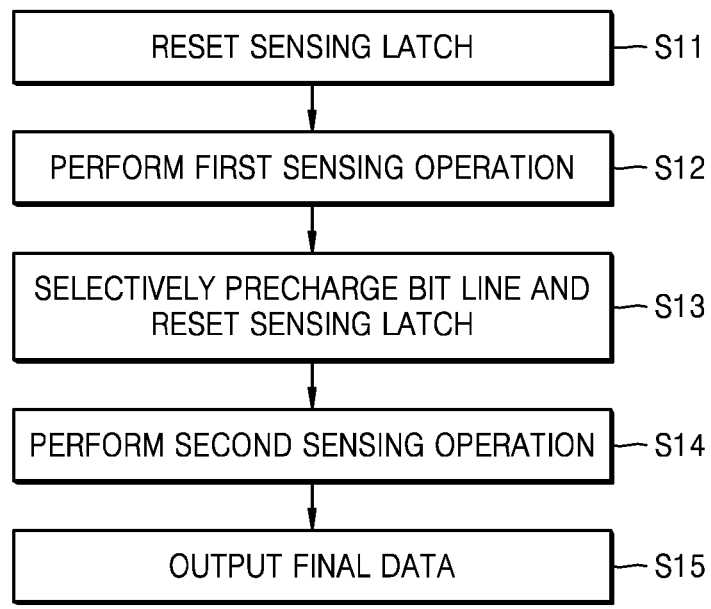
FIGS. 7 and 8 illustrate flowcharts for explaining read operations of a nonvolatile memory device according to embodiments of the inventive concepts.
Figure 8:
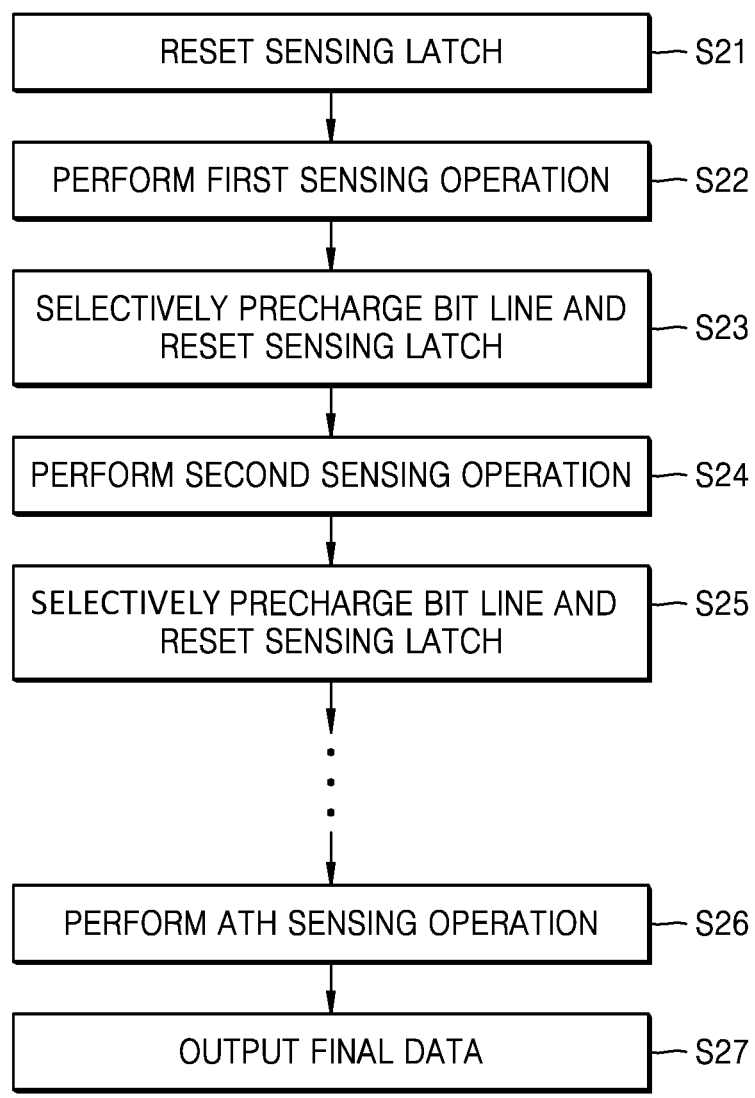

FIGS. 7 and 8 illustrate flowcharts for explaining read operations of a nonvolatile memory device according to embodiments of the inventive concepts.

FIG. 7 illustrates one read operation including two sensing operations, and an operation of a sensing latch disposed to correspond to one bit line. For example, in operation S11 a sensing latch connected to one bit line is reset in order to read data, responsive to the set/reset control signal SET/RESET from control logic 130 shown in FIG. 2. In operation S12 a first sensing operation is performed on a memory cell as a first sensing voltage is applied to the word line of the memory cell. A voltage level of a sensing node may be changed according to a result of the first sensing operation, and data according to the changed voltage level may be stored in the sensing latch.

In operation S13 a bit line may be selectively precharged by precharge circuit 240 such as shown in FIG. 5 for example, according to a state of the data stored in the sensing latch. If the data stored in the sensing latch has a second logic state corresponding to data of an off-cell, the bit line is precharged. After the precharging is performed, the sensing latch is reset responsive to the set/reset control signal SET/RESET. In operation S14 a second sensing operation is performed on the memory cell as a second sensing voltage is applied to the word line of the memory cell, and data according to the changed voltage level may be stored in the sensing latch. In operation S15 data stored in the sensing latch as a result of the second sensing operation is output as final data to an external controller.

FIG. 8 illustrates a method in which one read operation includes three or more sensing operations. A detailed explanation of the same or similar operations of FIG. 8 as or to those in FIG. 7 will not be given.

For example, in operation S21 a sensing latch connected to one bit line is reset responsive to the set/reset control signal SET/RESET in order to read data. In operation S22 a first sensing operation is performed on a memory cell as a first sensing voltage is applied to the memory cell. A voltage level of a sensing node is changed according to a result of the first sensing operation, and data according to the changed voltage level may be stored in the sensing latch.

Next, in operation S23 a bit line corresponding to the sensing latch is selectively precharged by precharge circuit 240 according to a state of the data stored in the sensing latch, and then the sensing latch is reset responsive to the set/reset control signal SET/RESET. Also, after the sensing latch is reset in operation S23, in operation S24 a second sensing operation is performed on the memory cell as a second sensing voltage is applied to the memory cell. A voltage level of a sensing node is changed according to a result of the second sensing operation, and data according to the changed voltage level may be stored in the sensing latch. In operation S25 a bit line corresponding to the sensing latch is selectively precharged according to a state of the data stored in the sensing latch, and then the sensing latch is reset again.

Such a sensing operation and a reset operation on the sensing latch are repeatedly performed, and in operation S26 an $A^{th}$ sensing operation is performed on the memory cell as an $A^{th}$ sensing voltage is applied to the memory cell, and data according to the changed voltage level may be stored in the sensing latch. In operation S27 data according to the $A^{th}$ sensing operation stored in the sensing latch may be output as final data to an external controller.

Figure 9:
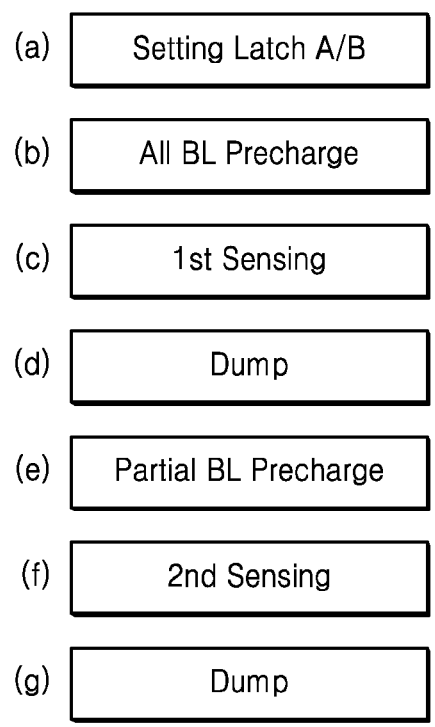
FIG. 9 illustrates a diagram for explaining read operations when a data dumping interval exists.

FIG. 9 illustrates a diagram for explaining read operations when a data dumping interval exists. In FIG. 9 a read operation includes two sensing operations.

Referring to FIG. 9, data (e.g., first data) stored in a sensing latch unit Latch A as a result of a first sensing operation is dumped to another latch unit (e.g., a data latch unit Latch B), according to a general data read operation. First, before the first sensing operation is performed, in operation 'a' a process of setting logic states of the sensing latch unit Latch A and the data latch unit Latch B is performed. For example, a logic state of the sensing latch unit Latch A may be changed to a first logic state through a set/reset operation. Thereafter in operation 'b' a plurality of bit lines may be precharged according to the logic state of the sensing latch Latch A. In particular, all bit lines are precharged in operation 'b' as values of all latches in the sensing latch unit Latch A correspond to the first logic state.

Next, in operation 'c' the first sensing operation (e.g., a coarse sensing operation) is performed, and a logic state of sensing latches may be changed according to the first sensing operation. For example, sensing latches corresponding to on-cells keep the first logic state, whereas sensing latches corresponding to off-cells are changed to a second logic state. In operation 'd' data stored in the sensing latch unit Latch A is dumped to the data latch unit Latch B. A logic state of data latches of the data latch unit Latch B may be changed according to a result of the dumping.

Next, in operation 'e' some bit lines (e.g., bit lines corresponding to the second logic state) are selectively precharged according to a logic state of data stored in the sensing latch unit Latch A. Also, in operation 'f' a second sensing operation is performed on memory cells connected to the bit lines that are selectively precharged, and a logic state of sensing latches according to a result of the first sensing operation may be changed again according to a result of the second sensing operation. For example, as a result of the second sensing operation, the sensing latches corresponding to the off-cells are changed from the second logic state to the first logic state.

Final data may be generated by combining the results of the first and second sensing operations. For example, in operation 'g' final data is generated through a dumping process between the data latch unit Latch B that stores the result of the first sensing operation and the sensing latch unit Latch A that reflects the result of the second sensing operation.

Figure 10:
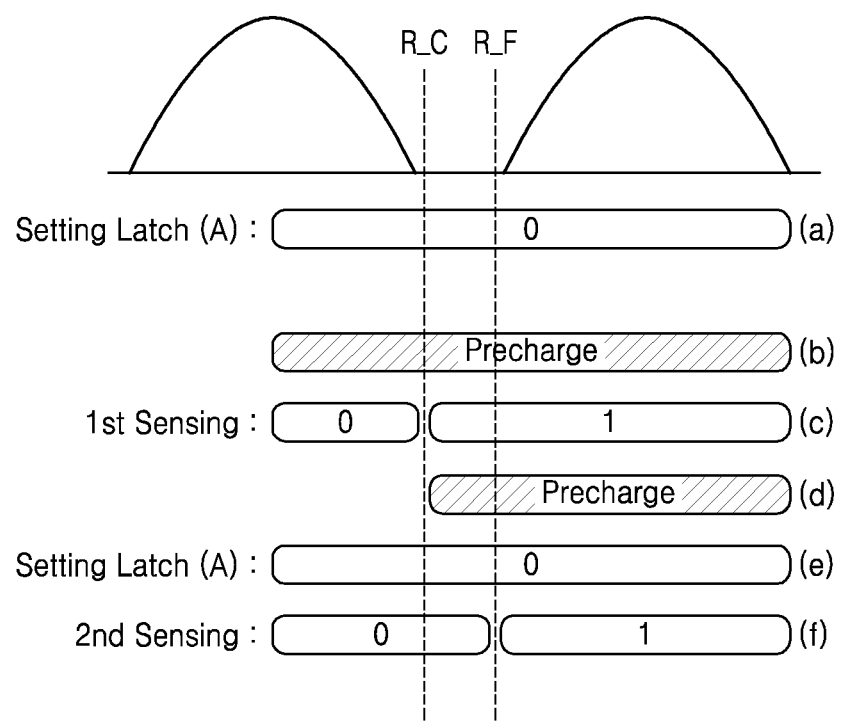
FIG. 10 illustrates a diagram for explaining read operations when a data dumping interval does not exist, such as in embodiments of the inventive concepts.

FIG. 10 illustrates a diagram for explaining read operations when a data dumping interval does not exists, such as in embodiments of the inventive concepts. In FIG. 10, a process of dumping sensed data is removed. In FIG. 10 a read operation includes two sensing operations.

Referring to FIG. 10, before a first sensing operation is performed, in operation 'a' a process of setting a logic state of the sensing latch unit Latch A is performed. For example, a logic state of the sensing latch unit Latch A is changed to a first logic state (e.g., logic state 0) through a set/reset operation. In operation 'b' bit lines may be precharged according to the logic state of the sensing latch unit Latch A. In particular, in operation 'b' a plurality of bit lines are precharged together as values of all latches in the sensing latch unit Latch A correspond to the first logic state. That is, in a read operation of FIG. 10, a process of setting an additional data latch unit may be avoided.

Next, in operation 'c' as a first sensing operation using a first sensing voltage R_C is performed, sensing latches corresponding to memory cells (e.g., on-cells) having a threshold voltage level lower than that of the first sensing voltage R_C keep the first logic state, whereas sensing latches corresponding to memory cells (e.g., off-cells) having a threshold voltage level higher than that of the first sensing voltage R_C are changed to a second logic state (e.g., logic state 1). That is, a result of the first sensing operation is stored as data in the sensing latch unit Latch A.

Next, in operation 'd' some bit lines may be selectively precharged according to a logic state of data stored in the sensing latch unit Latch A. For example, bit lines corresponding to a second logic state in the sensing latch unit Latch A are selectively precharged. Bit lines corresponding to the first logic state are not precharged. Also, after the some bit lines are precharged in operation 'd', in operation 'e' a process of setting the sensing latch unit Latch A is performed. For example, a logic state of the sensing latch unit Latch A is changed to the first logic state through a set/reset operation. In this case, while the logic state of the sensing latch unit Latch A is changed, connection between the precharged bit lines and the sensing latch unit Latch A is cut off, and thus the bit lines may keep a precharge level although the sensing latch unit Latch A is reset.

After the sensing latch unit Latch A is changed to the first logic state in operation 'e', in operation 'f' a second sensing operation using a second sensing voltage R_F is performed on memory cells connected to the precharged bit lines. Sensing latches corresponding to memory cells (e.g., on-cells) having a threshold voltage level lower than that of the second sensing voltage R_F keep the first logic state according to a result of the second sensing operation, whereas sensing latches corresponding to memory cells (e.g., off-cells) having a threshold voltage level higher than that of the second sensing voltage R_F are changed to the second logic state.

Data stored in the sensing latch unit Latch A according to the second sensing operation that is data distinguished based on the second sensing voltage R_F corresponding to a read level may correspond to final data. Accordingly, the data stored in the sensing latch unit Latch A according to the second sensing operation is output as final data to an external controller.

Since a result according to the first sensing operation does not need to be dumped to another latch unit, a time taken to perform a read operation may be reduced. Also, since a latch unit for temporarily dumping sensed data is not required, a size of a page buffer may be reduced. Also, when an additional latch unit is provided in the page buffer, the additional latch unit may be used to perform other functions during a read operation, thereby efficiently using resources.

Figure 11:
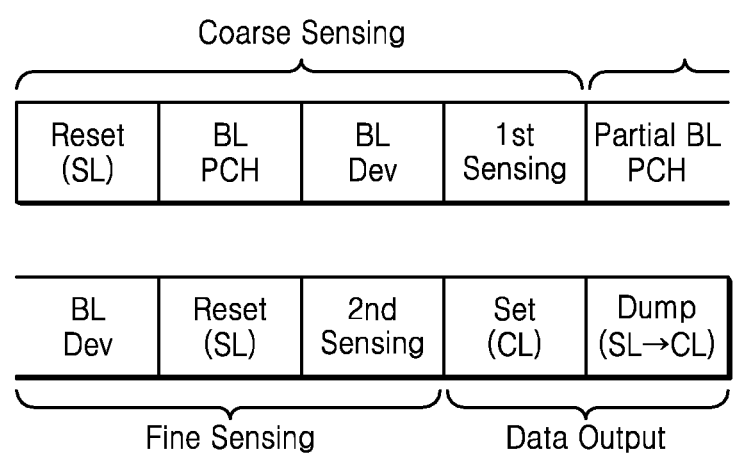
FIG. 11 illustrates a diagram of intervals of a read operation according to an embodiment of the inventive concepts.

FIG. 11 illustrates a diagram of intervals of a read operation according to an embodiment of the inventive concepts.

As an interval in which data stored in a sensing latch unit SL is dumped to another latch unit (e.g., a data latch DL in FIG. 5) is removed or avoided, a reset operation is performed on the sensing latch unit SL (Reset (SL)) and an interval in which the another latch unit is set or reset is not necessary and is removed. A bit line is precharged according to a logic state of the sensing latch unit SL (BL PCH), and a voltage of the bit line is developed (BL Dev) as a first sensing voltage is applied to a memory cell. Next, a voltage of a sensing node is sensed according to the developed bit line, and data according to a result of the sensing is stored in the sensing latch unit SL ($1^{st}$ Sensing). According to an embodiment, a first sensing operation (or a Coarse Sensing operation) may be completed without dumping first data stored in the sensing latch SL to another latch unit.

Next, a bit line is selectively precharged according to a logic state of the data stored in the sensing latch unit SL (Partial BL PCH), and after the precharge operation is completed, the sensing latch unit SL is reset (Reset (SL)). Next, as a second sensing voltage is applied to the memory cell, a voltage of the bit line is developed. Next, a voltage of a sensing node is sensed according to the developed bit line, and data according to a result of the sensing is stored in the sensing latch unit SL ($2^{nd}$ Sensing). Such a series of operations may constitute a second sensing operation (or a Fine Sensing operation).

According to an embodiment, when final data stored in the sensing latch unit SL is to be transmitted to an external controller through a cache latch unit CL, the catch latch unit CL is first set (Set (CL)), and the final data stored in the sensing latch unit SL is then dumped to the cache latch unit CL (Dump (SL→CL)). Data stored in the cache latch unit CL may be transmitted to the external controller. Such a series of operations may constitute a Data Output operation.

Figure 12:
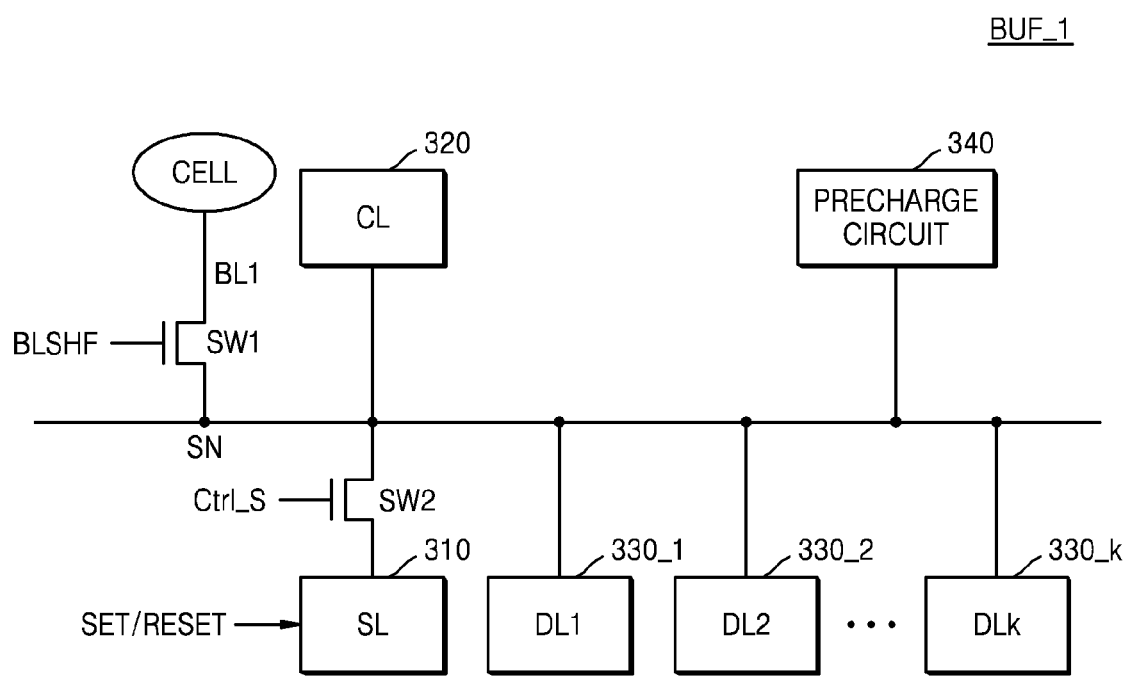
FIG. 12 illustrates a block diagram of a buffer connected to one bit line in a page buffer according to an embodiment of the inventive concepts.

FIG. 12 illustrates a block diagram of a buffer in a page buffer connected to one bit line BL1 according to an embodiment of the inventive concepts. A detailed explanation of the same or similar elements of FIG. 12 as or to those in FIG. 5 will not be given.

As shown in FIG. 12, one buffer (e.g., a first buffer BUF_1) includes a sensing latch (SL) 310, a cache latch (CL) 320, one or more data latches (DL1, DL2, . . . DLk), for example, first through $k^{th}$ data latches 330_1, and 330_2 through 330_$k$ (hereinafter referred to as first through $k^{th}$ data latches 330_1 through 330_$k$), a precharge circuit 340, and one or more switches, for example, first and second switches SW1 and SW2. For example, the first switch SW1 is connected between a bit line BL1 and a sensing node SN, and the second switch SW2 is connected between the sensing node SN and the sensing latch 310. Although not shown in FIG. 12, the buffer may further include additional switches for controlling electrical connection between the sensing node SN and other latches.

The bit line BL1 is precharged by the precharge circuit 340, and a voltage of the first bit line BL1 is developed according to data stored in a memory cell (CELL). The first switch SW1 is controlled to be turned on or off in response to a first control signal BLSHF, and the first bit line BL1 and the sensing node SN are electrically connected to each other as the first switch SW1 is turned on. Accordingly, a develop result of the first bit line BL1 is transmitted to the sensing node SN, and a logic state of data stored in the sensing latch 310 is determined according to a voltage of the sensing node SN.

According to an embodiment, after a first sensing operation is performed and before a second sensing operation is performed, the sensing latch 310 may be set or reset according to a set/reset control signal SET/RESET. Also, data according to the second sensing operation may be stored in the set or reset sensing latch 310 without dumping the data stored in the sensing latch 310 to another latch.

The cache latch 320 may temporarily store write data or read data to transmit/receive data to/from an external controller. Also, according to an embodiment, the first through $k^{th}$ data latches 330_1 through 330_$k$ may be used to perform functions other than a function of storing of sensed data, in a read operation performed on the memory cell.

The sensing latch 310 may be set or reset when electrical connection between the sensing latch 310 and the sensing node SN is cut off. For example, after the first sensing operation is completed, electrical connection between the sensing latch 310 and the sensing node SN may be cut off as the second switch SW2 is turned off in response to a second control signal Ctrl_S, and a logic state of the sensing latch 310 may be changed to a first logic state as the sensing latch 310 is reset. Next, the second switch SW2 is turned on again in order to perform the second sensing operation, and a logic state of data stored in the sensing latch 310 is determined according to a voltage of the sensing node SN. A result of the second sensing operation may be stored as final data in the sensing latch 310, and the final data stored in the sensing latch 310 may be transmitted to the external controller through the cache latch 320. In FIG. 12, the first control signal BLSHF, the set/reset control signal SET/RESET and the second control signal Ctrl_S may be provided by control logic 130 as shown in FIG. 2 for example.

Figure 13:
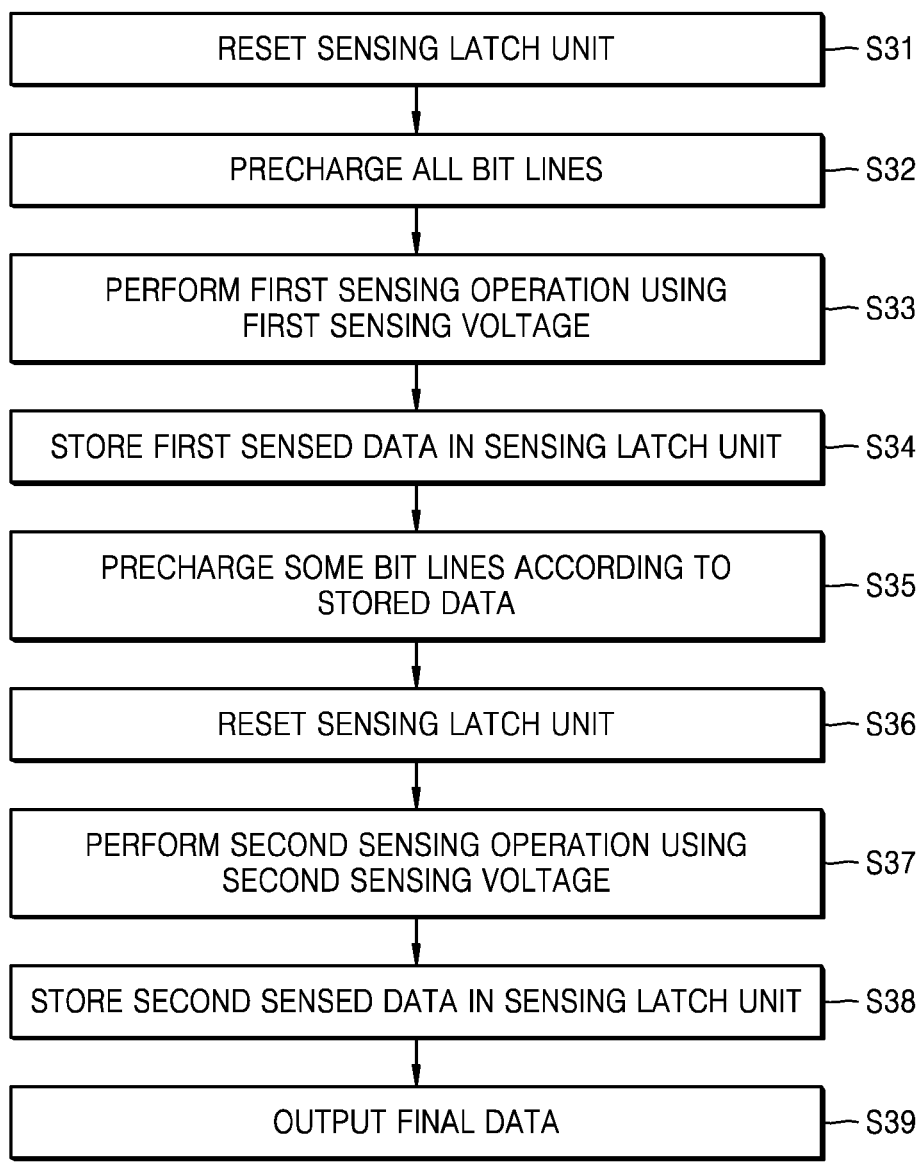
FIG. 13 illustrates a flowchart for explaining a read method of a memory device according to an embodiment of the inventive concepts.

FIG. 13 illustrates a flowchart of a read method of a memory device according to an embodiment of the inventive concepts. A method of controlling a sensing latch unit connected to a plurality of bit lines to be set/reset will be explained with reference to FIG. 13.

Referring to FIG. 13, in operation S31 as a read command is received, a sensing latch unit connected to a plurality of bit lines through sensing nodes is reset. Accordingly, a logic state of the sensing latch unit is changed to a first logic state. Also, in operation S32 the bit lines may be precharged based on the logic state of the sensing latch unit. For example, all bit lines are precharged as all sensing latches of the sensing latch unit are changed to the first logic state.

After the bit lines are precharged in operation S32, in operation S33 a first sensing operation using a first sensing voltage is performed. In operation S34 voltages of the sensing nodes disposed to correspond to the bit lines may be changed according to the first sensing operation, and first sensed data corresponding to the changed voltages of the sensing nodes is stored in the sensing latch unit.

After the first sensing operation corresponding to a coarse sensing operation ends, a second sensing operation corresponding to a fine sensing operation is performed on some memory cells from among a plurality of memory cells to be read. In operation S35, according to the second sensing operation, the bit lines are selectively precharged based on a logic state of the sensing latch unit, and thus some bit lines are precharged according to the data stored in the sensing latch unit. Also, after the some bit lines are precharged in operation S35, in operation S36 the sensing latch unit is reset. In operation S37 the second sensing operation using a second sensing voltage is selectively performed on memory cells corresponding to the some precharged bit lines.

In operation S38 data sensed according to the second sensing operation is stored in the sensing latch unit having a reset state. Also, in operation S39 the data stored in the sensing latch unit according to the second sensing operation may be output as final data to an external controller.

Figure 14:
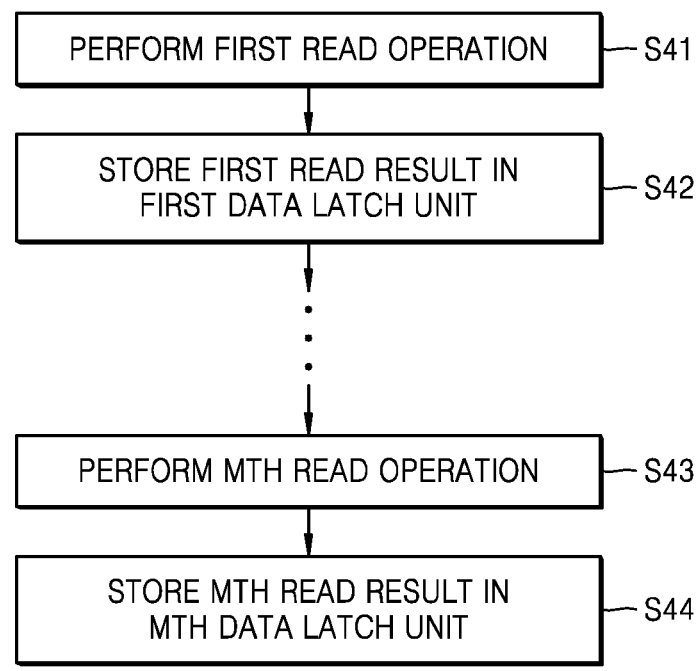
FIGS. 14 and 15 illustrate diagrams for explaining various uses of a latch unit additionally provided in a page buffer according to embodiments of the inventive concepts.
Figure 15:
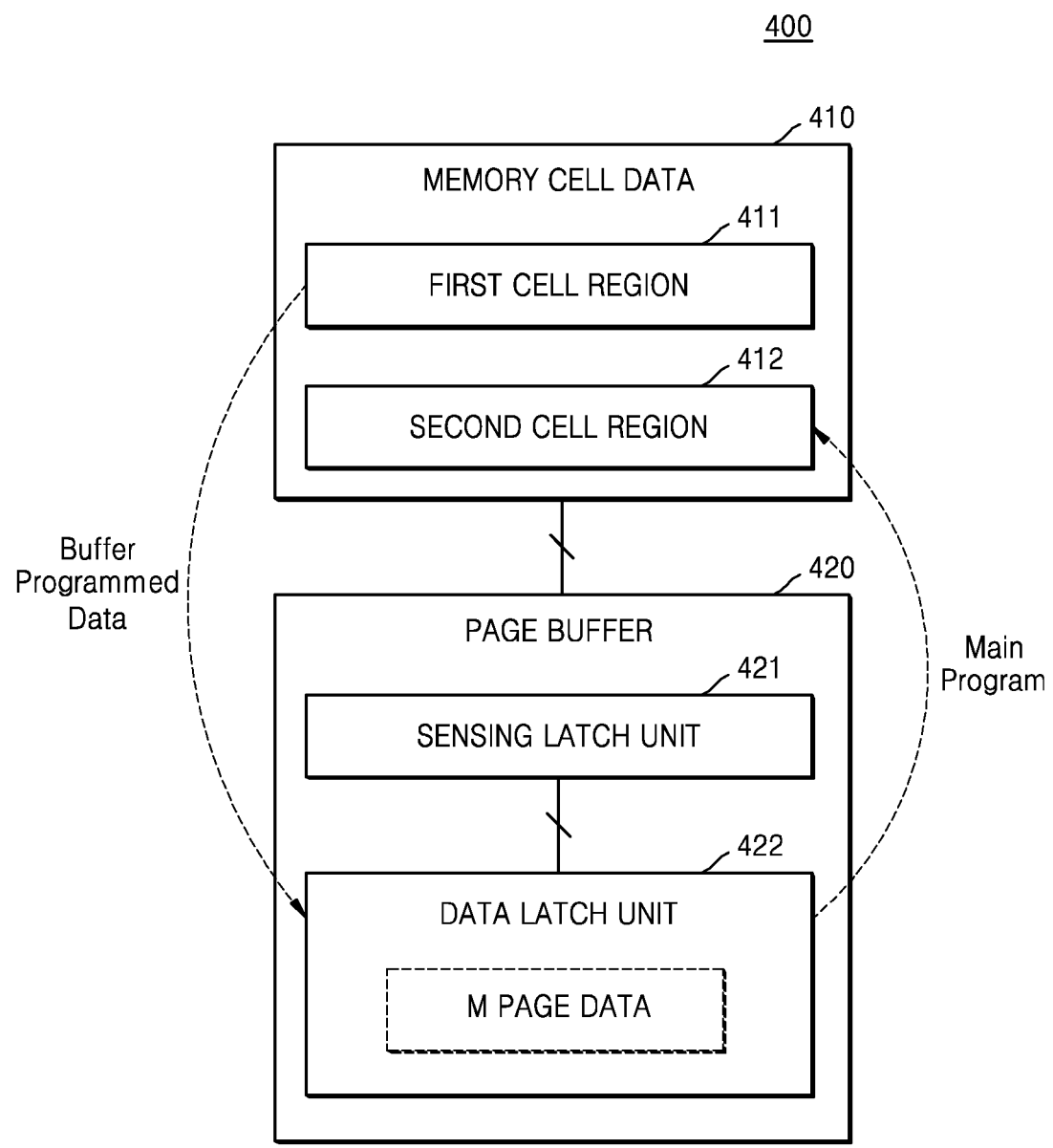

FIGS. 14 and 15 illustrate diagrams for explaining various uses of a latch unit additionally provided in a page buffer according to embodiments of the inventive concepts. In FIGS. 14 and 15, it is assumed that a page buffer includes at least one data latch unit in addition to a sensing latch unit.

Referring to FIG. 14, a plurality of read operations may be continuously performed. Also, each of the read operations may include a plurality of sensing operations. For example, each read operation may include a coarse sensing operation and a fine sensing operation. Also, when the plurality of sensing operations are performed, final data may be stored in a sensing latch unit without dumping sensed data to another latch unit (e.g., a data latch unit).

First, in operation S41, a first read operation is performed. A first read result according to the first read operation is stored in a sensing latch unit. Also, in operation S42 the first read result is stored in a first data latch unit as the first read result is dumped from the sensing latch unit to the first data latch unit.

Through such continuous read processes, first through M−1$^{th}$ read results may be stored in one or more data latch units. Next, in operation S43, an Mth read operation is performed, and a plurality of sensing operations are performed during the M$^{th}$ read operation. Even when a read result of a previous read operation is stored in a data latch unit, since data sensed in a plurality of sensing operations is not dumped to a data latch unit as described above, the M$^{th}$ read operation may be normally performed. In operation S44 an M$^{th}$ read result is stored in an M$^{th}$ data latch unit.

FIG. 15 illustrates an on-chip buffer program performed by a memory device to which an operation according to an embodiment of the inventive concepts is applied.

Referring to FIG. 15, a memory device 400 includes a memory cell array 410 and a page buffer 420. The memory device 400 may store data in the memory cell array 410 according to an on-chip buffer program method. The on-chip buffer program method may include a buffer program operation in which data to be written is programmed to a region of the memory cell array 410, and a main program operation in which the data programmed to the region is programmed to another region of the memory cell array 410.

For example, the memory cell array 410 includes a first cell region 411 including single-level cells SLC, and a second cell region 412 including multi-level cells MLC. Although a memory cell that stores two or more bits is referred to as a multi-level cell MLC, memory cells included in the second cell region 412 may include triple-level cells TLC. Also, the page buffer 420 includes a sensing latch unit 421 and at least one data latch unit 422. According to the above embodiments, final data may be generated without a process of dumping data to the data latch unit 422 in a read operation.

According to an on-chip buffer program method, a plurality of pieces of write data may be buffer-programmed and temporarily stored in the single-level cells SLC of the first cell region 411, and the buffer-programmed data may be read for a main program operation and may be temporarily stored in the page buffer 420. Also, the data stored in the page buffer 420 may be main-programmed to the second cell region 412.

According to an embodiment, a plurality of pieces of buffer-programmed data (e.g., M pieces of page data) may be read from the first cell region 411 through continuous read operations, and may be stored in the data latch unit 422. That is, while the continuous read operations are performed, data that has been completely read and generated before a current read operation may be kept in the data latch unit 422 during the current read operation. When all of the M pieces of page data are read through the continuous read operations, the read data is main-programmed to the second cell region 412.

Figure 16:
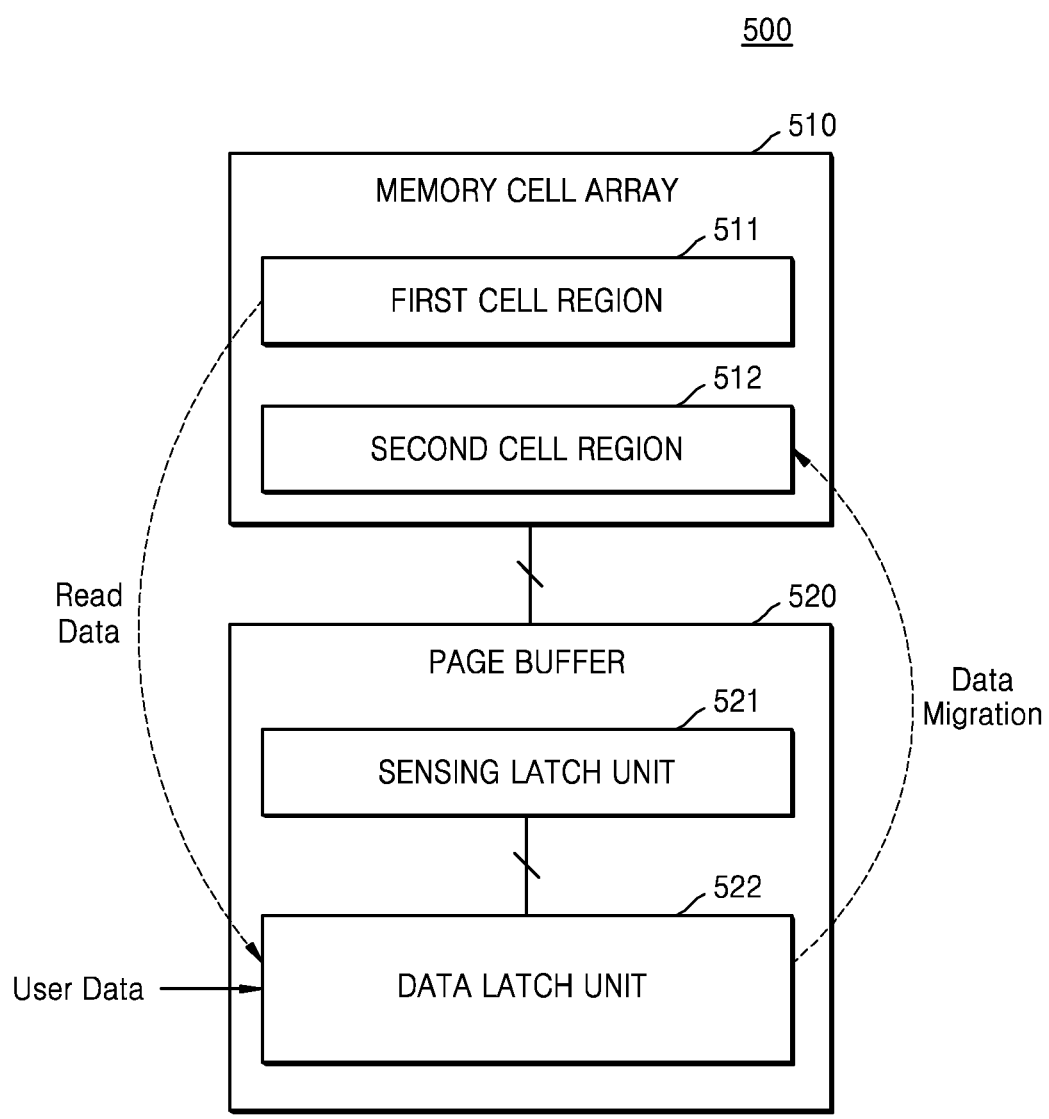
FIG. 16 illustrates a block diagram of a memory device for explaining another use of a data latch unit provided in a page buffer according to an embodiment of the inventive concepts.

FIG. 16 illustrates a block diagram of a memory device for explaining another use of a data latch unit provided in a page buffer according to an embodiment of the inventive concepts.

Referring to FIG. 16, a memory device 500 includes a memory cell array 510 and a page buffer 520. The memory cell array 510 includes at least two regions, for example, a first cell region 511 including single-level cells SLC and a second cell region 512 including multi-level cells MLC. Also, the page buffer 520 includes a sensing latch unit 521 and at least one data latch unit 522. According to the above embodiments, final data may be generated without a process of dumping data to the data latch unit 522 in a read operation.

When memory cells of the second cell region 512 store three bits per cell, data previously stored in the first cell region 511 may be transferred to the second cell region 512 according to any of various methods. For example, data corresponding to three pages may be read from the first cell region 511 and may be transferred to the second cell region 512. Alternatively, data corresponding to three pages including user data from an external controller and data read from the first cell region 511 may be transferred to the second cell region 512.

According to an embodiment, user data un-related to a data read operation on the first cell region 511 may be stored in the data latch unit 522. That is, even when the user data is stored in the data latch unit 522, data of the first cell region 511 may be read without using the data latch unit 522. Data corresponding to a plurality of pages stored in the page buffer 520 may be transferred to the second cell region 512 through the above process.

Although a read operation includes a plurality of sensing operations in the above embodiments, the inventive concept is not limited thereto. For example, a verify operation for determining whether a program operation has succeeded or failed in a write operation may be performed, and the embodiments may be applied to a process of reading data for the verify operation in a similar or identical manner.

Figure 17:
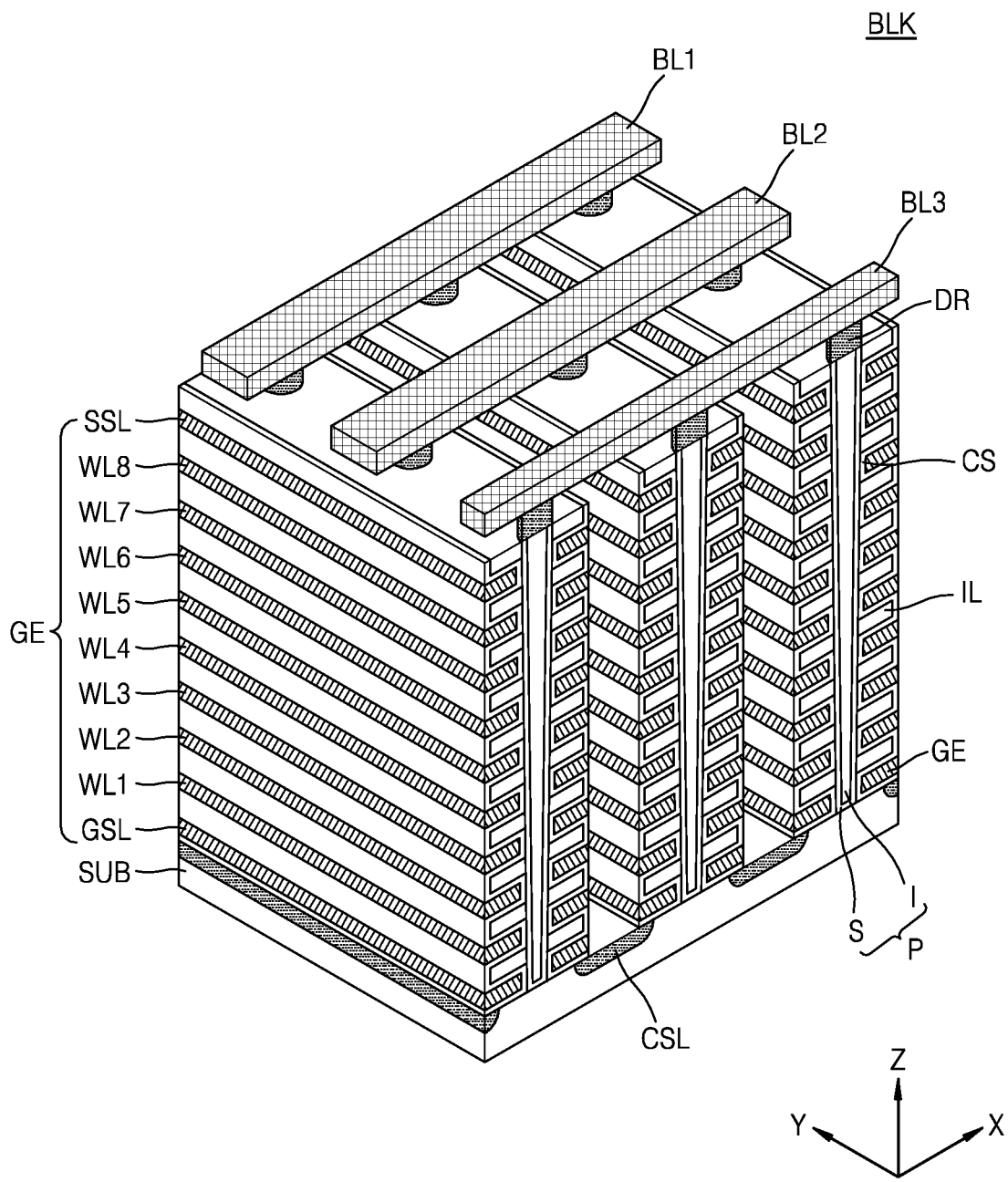
FIG. 17 illustrates a perspective view of one cell block provided in a memory cell array of FIG. 1 according to an embodiment of the inventive concepts.

FIG. 17 illustrates a perspective view of one cell block provided in the memory cell array 110 of FIG. 1 according to an embodiment of the inventive concepts.

Referring to FIG. 17, a cell block BLK is formed in a direction perpendicular to a substrate SUB. Although the cell block BLK includes two selection lines GSL and SSL, eight word lines WL1 through WL8, and three bit lines, e.g., first through third bit lines BL1 through BL3 in FIG. 17, the cell block BLK may include more or fewer lines.

The substrate SUB has a first conductivity type (e.g., a p-type), and a common source line CSL extends in a first direction (e.g., a Y direction) in the substrate SUB and is doped with impurities having a second conductivity type (e.g., an n-type). A plurality of insulating films IL that extend in the first direction are sequentially provided in a third direction (e.g., a Z direction) on a portion of the substrate SUB between two adjacent common source lines CSL, and are spaced apart by a predetermined distance from each other in the third direction. For example, the plurality of insulating films IL may include an insulating material such as silicon oxide.

A plurality of pillars P that pass through the plurality of insulating films IL in the third direction and are sequentially arranged in the first direction are provided on a portion of the substrate SUB between two adjacent common source lines CSL. For example, the plurality of pillars P may pass through the plurality of insulating films IL and may contact the substrate SUB. In detail, a surface layer S of each of the pillars P may include a silicon material having a first type and may function as a channel region. An inner layer I of each pillar P may include an insulating material such as silicon oxide or an air gap.

A charge storage layer CS is provided along exposed surfaces of the insulating films IL, the pillars P, and the substrate SUB in a portion between two adjacent common source lines CSL. The charge storage layer CS may include a gate insulating layer (or referred to as a 'tunneling insulating layer'), a charge trap layer, and a blocking insulating layer. For example, the charge storage layer CS may have an oxide-nitride-oxide (ONO) structure. Also, a gate electrode GE such as each of the selection lines GSL and SSL and the word lines WL1 through WL8 is provided on an exposed surface of the charge storage layer CS in a portion between two adjacent common source lines CSL.

Drains or drain contacts DR are provided on the plurality of pillars P. For example, the drains or drain contacts DR may include a silicon material doped with impurities having a second conductivity type. The first through third bit lines BL1 through BL3 that extend in a second direction (e.g., an X direction) and are spaced apart by a predetermined distance from each other in the first direction are provided on the drain or drain contacts DR.

Figure 18:
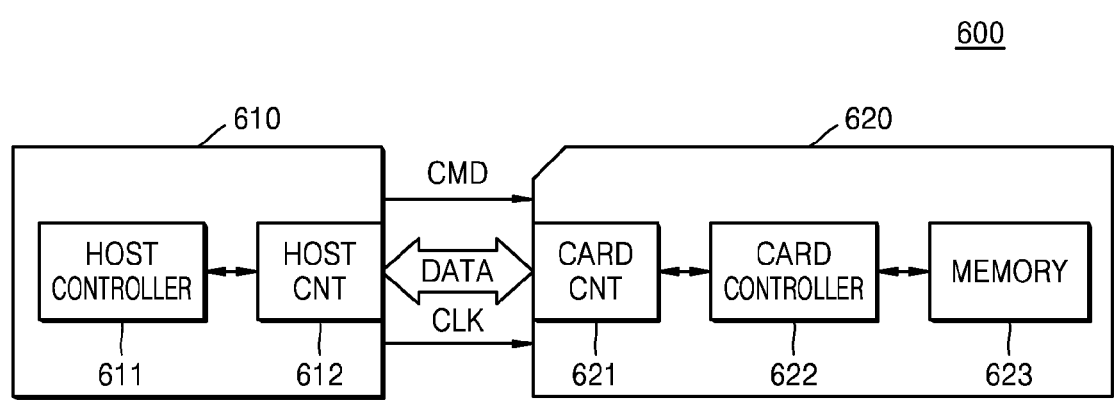
FIG. 18 illustrates a block diagram of an example where a memory system is applied to a memory card system according to an embodiment of the inventive concepts.

FIG. 18 illustrates a block diagram of an example where a memory system is applied to a memory card system 600 according to an embodiment of the inventive concepts. It is assumed that the memory system is, for example, a flash memory system.

Referring to FIG. 18, the memory card system 600 includes a host 610 and a memory card 620. The host 610 includes a host controller 611 and a host connector (HOST CNT) 612. The memory card 620 includes a card connector (CARD CNT) 621, a card controller 622, and a memory system 623. In this case, the memory system 623 may be realized by using the embodiments of FIGS. 1 through 17. Accordingly, the memory system 623 may read data according to any of the above embodiments. For example, data may be stored in a sensing latch unit according to one sensing operation, and a process of dumping the stored data to another latch unit may be avoided. Also, an operation of controlling the sensing latch unit to be set or reset may be additionally performed between sensing operations.

The host 610 may write data to the memory card 620 or may read data stored in the memory card 620. The host controller 611 may transmit a command CMD, a clock signal CLK generated by a clock generator (not shown) in the host 610, and data DATA to the memory card 620 through the host connector 612.

The card controller 622 may synchronize data with a clock signal generated by a clock generator (not shown) in the card controller 622 and may store the data in the memory system 623, in response to a request received through the card connector 621. The memory system 623 may store the data received from the host 610.

The memory card 620 may be for example any of a compact flash card (CFC), a microdrive, a smart media card (SMC), a multimedia card (MMC), a security digital card (SDC), a memory stick, and a USB flash memory driver, or the like.

Figure 19:
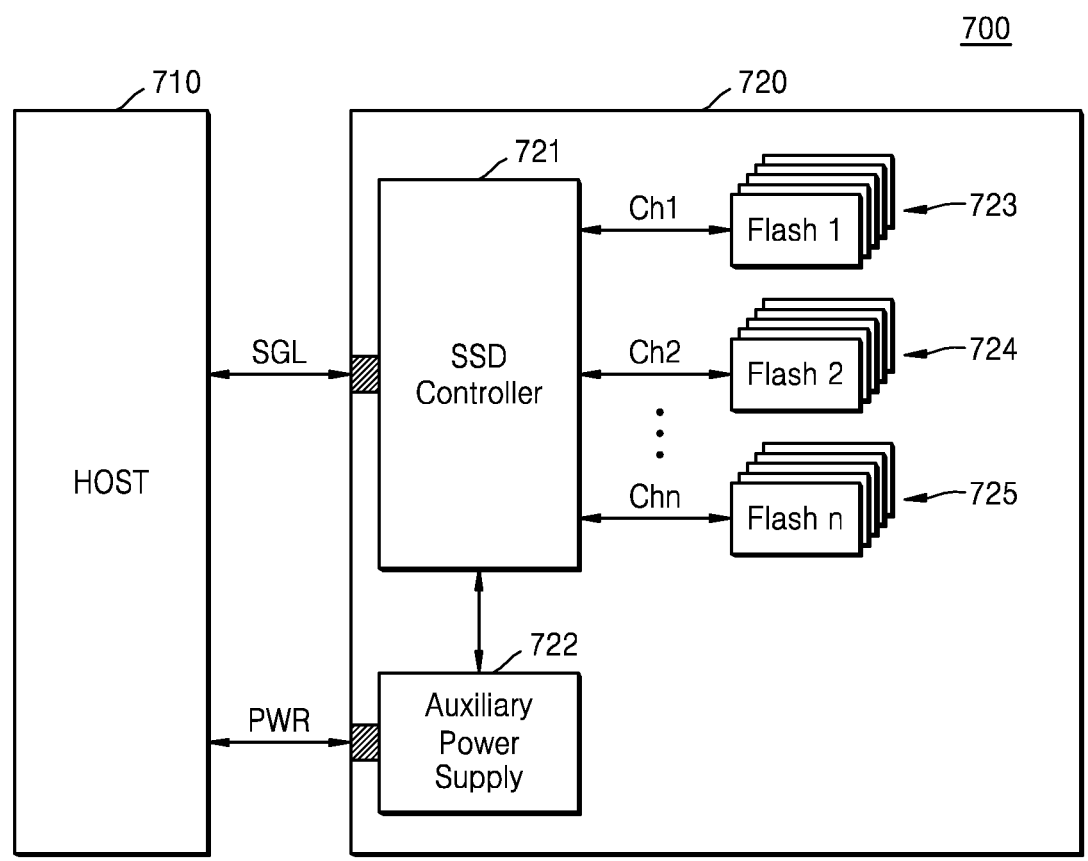
FIG. 19 illustrates a block diagram of an example where a memory device is applied to a solid-state drive (SSD) system according to embodiments of the inventive concepts.

FIG. 19 illustrates a block diagram of an example where a memory device is applied to a solid-state drive (SSD) system 700 according to embodiments.

Referring to FIG. 19, the SSD system 700 includes a host 710 and an SSD 720. The SSD 720 transmits/receives a signal SGL to/from the host 710 through a signal connector, and receives power PWR through a power connector. The SSD 720 includes an SSD controller 721, an auxiliary power supply 722, and a plurality of nonvolatile memory systems 723, 724, and 725. In this case, each of the plurality of nonvolatile memory systems 723, 724, and 725 may include a memory device according to embodiments of the inventive concepts. For example, the nonvolatile memory systems may respectively include one or more flash memory devices Flash 1, Flash 2 and Flash n. The nonvolatile memory systems 723, 724, and 725 may for example be respectively connected to the SSD controller 721 through channels Ch1, Ch2 and Chn. Accordingly, each of the nonvolatile memory systems 723, 724, and 725 may perform a data read operation according to any of the above embodiments. For example, data may be stored in a sensing latch unit according to one sensing operation, and a process of dumping the stored data to another latch unit may be avoided. Also, an operation of controlling the sensing latch unit to be set or reset may be additionally performed between sensing operations.

According to a nonvolatile memory device and a method of operating the same of the one or more embodiments, since a data dumping interval is removed (avoided) in a read process including a plurality of sensing operations, a speed of a read operation may be increased.

Also, according to the nonvolatile memory device and the method of operating the same of the one or more embodiments, since an additional latch unit for dumping data is not required, a size of a page buffer may be reduced. Also, when the page buffer includes the additional latch unit, the additional latch unit may be used to perform functions other than a function of backing up data.

While the inventive concepts have been particularly shown and described with reference to embodiments thereof using specific terms, it should be understood that the embodiments have been used to explain the inventive concepts and should not be construed as limiting the scope of the inventive concepts defined by the claims. Accordingly, it should be understood by those of ordinary skill in the art that various changes in form and details may be made therein without departing from the spirit and scope of the inventive concepts as defined by the following claims.

What is claimed is:

1. A method of operating a nonvolatile memory device, the method comprising:
    performing a first sensing operation on memory cells of the nonvolatile memory device using a first sensing voltage;
    precharging some bit lines from among a plurality of bit lines connected to the memory cells, according to first data stored in a first latch unit of a page buffer due to the first sensing operation;
    resetting the first latch unit after said precharging; and
    performing a second sensing operation on the memory cells using a second sensing voltage.

2. The method of claim 1, further comprising storing second data sensed according to the second sensing operation in the first latch unit.

3. The method of claim 2, further comprising transmitting the stored second data to an external controller as read data.

4. The method of claim 3, wherein the nonvolatile memory device further comprises a second latch unit configured to transmit data to the external controller and to receive data from the external controller,
    wherein the transmitting of the stored second data to the external controller as the read data comprises:
    dumping the second data stored in the first latch unit to the second latch unit; and
    transmitting the second data dumped to the second latch unit to the external controller.

5. The method of claim 1, further comprising:
    resetting the first latch unit to a first logic state before the first sensing operation; and
    precharging all of the plurality of bit lines together according to the first logic state of the first latch unit before the first sensing operation.

6. The method of claim 1, wherein the first sensing operation is a coarse sensing operation using the first sensing voltage having a pre-read level, and the second sensing operation is a fine sensing operation using the second sensing voltage having a read level,
    wherein the pre-read level is lower than the read level.

7. The method of claim 1, wherein the memory cells of the nonvolatile memory device comprise multi-level memory cells, and the nonvolatile memory device performs a plurality of read operations in response to a read command received from an external controller,
    wherein each of the plurality of read operations comprises at least the first and second sensing operations.

8. The method of claim 1, wherein the page buffer further comprises a second latch unit, wherein while the first and second sensing operations are performed, data un-related to the first and second sensing operations is stored in the second latch unit.

9. The method of claim 8, further comprising, before the performing of the first sensing operation, performing a first read operation,
    wherein while the first and second sensing operations are performed, data related to the first read operation is stored in the second latch unit.

10. The method of claim 1, wherein the nonvolatile memory device comprises a switch unit configured to control electrical connection between at least one sensing node and the first latch unit,
    wherein during the resetting of the first latch unit, the switch unit is turned off.

11. The method of claim 1, further comprising:
    precharging some bit lines from among the plurality of bit lines according to second data stored in the first latch unit due to the second sensing operation;
    resetting the first latch unit after the precharging according to the second data; and
    performing a third sensing operation using a third sensing voltage.

12. A method of operating a nonvolatile memory device comprising a page buffer, the page buffer comprising a first latch unit connected to sensing nodes and a second latch unit electrically connected to the first latch unit, the method comprising:
    storing a result of a first sensing operation performed on a plurality of memory cells in the first latch unit, in response to a read command;
    selectively precharging some bit lines from among a plurality of bit lines connected to the plurality of memory cells according to a logic state of the first latch unit;
    after the selectively precharging, setting the first latch unit to a first logic state without dumping the result of the first sensing operation stored in the first latch unit to the second latch unit; and
    storing a result of a second sensing operation performed on at least some memory cells from among the plurality of memory cells in the first latch unit.

13. The method of claim 12, further comprising:
    setting the first latch unit to the first logic state in response to the read command before the first sensing operation; and
    precharging the plurality of bit lines according to the set first logic state of the first latch unit before the first sensing operation.

14. The method of claim 12, wherein the setting of the first latch unit to the first logic state comprises setting the first latch unit to the first logic state by setting or resetting the first latch unit.

15. The method of claim 12, wherein the first sensing operation is a coarse sensing operation using a first sensing voltage having a pre-read level, and the second sensing operation is a fine sensing operation using a second sensing voltage having a read level.

16. A method of operating a nonvolatile memory device comprising:
    setting a logic state of a first latch unit to a first logic state;
    precharging all of a plurality of bit lines connected to the first latch unit according to the set logic state of the first latch unit;
    after the precharging, performing a first sensing operation on memory cells connected to the plurality of bit lines using a first sensing voltage and storing a result of the first sensing operation as data in the first latch unit;
    selectively precharging some of the plurality of bit lines according to a logic state of the data stored in the first latch unit;
    after the selectively precharging, setting the logic state of the first latch unit to the first logic state; and performing a second sensing operation on the memory cells using a second sensing voltage and storing a result of the second sensing operation in the first latch unit as final data.

17. The method of claim 16, wherein the setting the logic state of the first latch unit after the selectively precharging is performed while the plurality of bit lines are disconnected from the first latch unit.

18. The method of claim 16, further comprising outputting the final data stored in the first latch unit to an external controller.

19. The method of claim 16, wherein the first sensing operation is a coarse sensing operation and the first sensing voltage comprises a pre-read voltage, and the second sensing operation is a fine sensing operation and the second sensing voltage comprises a read voltage that is greater than the pre-read voltage.

20. The method of claim 16, wherein the nonvolatile memory device comprises a second latch unit, wherein data un-related to the first and second sensing operations is stored in the second latch unit while the first and second sensing operations are performed.

* * * * *